United States Patent
Zhang et al.

(10) Patent No.: US 10,304,719 B2
(45) Date of Patent: May 28, 2019

(54) DEEP TRENCH ISOLATION WITH TANK CONTACT GROUNDING

(71) Applicant: Texas Instruments Incorporated, Dallas, TX (US)

(72) Inventors: Yongxi Zhang, Plano, TX (US); Eugen Mindricelu, Dallas, TX (US); Sameer Pendharkar, Allen, TX (US); Seetharaman Sridhar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/413,118

(22) Filed: Jan. 23, 2017

(65) Prior Publication Data

US 2017/0133261 A1  May 11, 2017

Related U.S. Application Data

(62) Division of application No. 14/101,435, filed on Dec. 10, 2013, now Pat. No. 9,553,011.

(Continued)

(51) Int. Cl.
*H01L 27/088* (2006.01)
*H01L 21/761* (2006.01)
(Continued)

(52) U.S. Cl.
CPC .... *H01L 21/761* (2013.01); *H01L 21/823481* (2013.01); *H01L 21/823493* (2013.01);
(Continued)

(58) Field of Classification Search
CPC ........... H01L 21/761; H01L 21/823481; H01L 21/823493; H01L 27/0251; H01L 27/0207; H01L 23/5283
(Continued)

(56) References Cited

U.S. PATENT DOCUMENTS 4,819,052 A 4/1989 Hutter
5,065,273 A 11/1991 Rajeevakumar
(Continued)

OTHER PUBLICATIONS

Prosecution History from U.S. Appl. No. 14/101,435, dated Dec. 10, 2013 to Jan. 6, 2017, 187 pp.

*Primary Examiner* — Anthony Ho
*Assistant Examiner* — Mohammad M Hoque
(74) *Attorney, Agent, or Firm* — Andrew R. Ralston; Charles A. Brill; Frank D. Cimino

(57) ABSTRACT

An integrated circuit is formed on a substrate containing a semiconductor material having a first conductivity type. A deep well having a second, opposite, conductivity type is formed in the semiconductor material of the first conductivity type. A deep isolation trench is formed in the substrate through the deep well so as separate an unused portion of the deep well from a functional portion of the deep well. The functional portion of the deep well contains an active circuit element of the integrated circuit. The separated portion of the deep well does not contain an active circuit element. A contact region having the second conductivity type and a higher average doping density than the deep well is formed in the separated portion of the deep well. The contact region is connected to a voltage terminal of the integrated circuit.

18 Claims, 12 Drawing Sheets

Related U.S. Application Data

(60) Provisional application No. 61/747,080, filed on Dec. 28, 2012.

(51) Int. Cl.
*H01L 27/02* (2006.01)
*H01L 21/8234* (2006.01)
*H01L 23/528* (2006.01)

(52) U.S. Cl.
CPC ...... *H01L 23/5283* (2013.01); *H01L 27/0207* (2013.01); *H01L 27/0251* (2013.01)

(58) Field of Classification Search
USPC ........................................... 257/401
See application file for complete search history.

(56) References Cited

U.S. PATENT DOCUMENTS

| | | |
|---|---|---|
| 5,187,550 A | 2/1993 | Yanagisawa |
| 5,754,380 A * | 5/1998 | Ker ............... H01L 27/0251 257/E29.216 |
| 6,064,099 A * | 5/2000 | Yamada ............... H01L 21/743 257/372 |
| 6,180,986 B1 | 1/2001 | Ishida |
| 6,486,525 B1 | 11/2002 | Aton |
| 6,541,845 B2 | 4/2003 | Beroz et al. |
| 6,583,476 B1 | 6/2003 | Miller et al. |
| 2003/0094608 A1 | 5/2003 | Abadeer et al. |
| 2003/0164521 A1* | 9/2003 | Kojima ............... H01L 27/0266 257/355 |
| 2005/0017306 A1 | 1/2005 | Morishita |
| 2005/0045952 A1 | 3/2005 | Chatty et al. |
| 2006/0044719 A1 | 3/2006 | Chen et al. |
| 2006/0110909 A1 | 5/2006 | Hershberger et al. |
| 2006/0226488 A1 | 10/2006 | Schneider et al. |
| 2007/0069309 A1* | 3/2007 | Lindsay ............... H01L 29/1087 257/408 |
| 2008/0013230 A1 | 1/2008 | Suzuki |
| 2008/0111154 A1 | 5/2008 | Voldman |
| 2008/0224220 A1 | 9/2008 | Blanc et al. |
| 2012/0098041 A1 | 4/2012 | Verma |
| 2012/0193532 A1* | 8/2012 | Wang ............... G01R 31/307 250/309 |
| 2012/0286343 A1 | 11/2012 | Matsuo |
| 2012/0299080 A1 | 11/2012 | Dennard et al. |
| 2013/0044838 A1 | 2/2013 | Ding et al. |

* cited by examiner

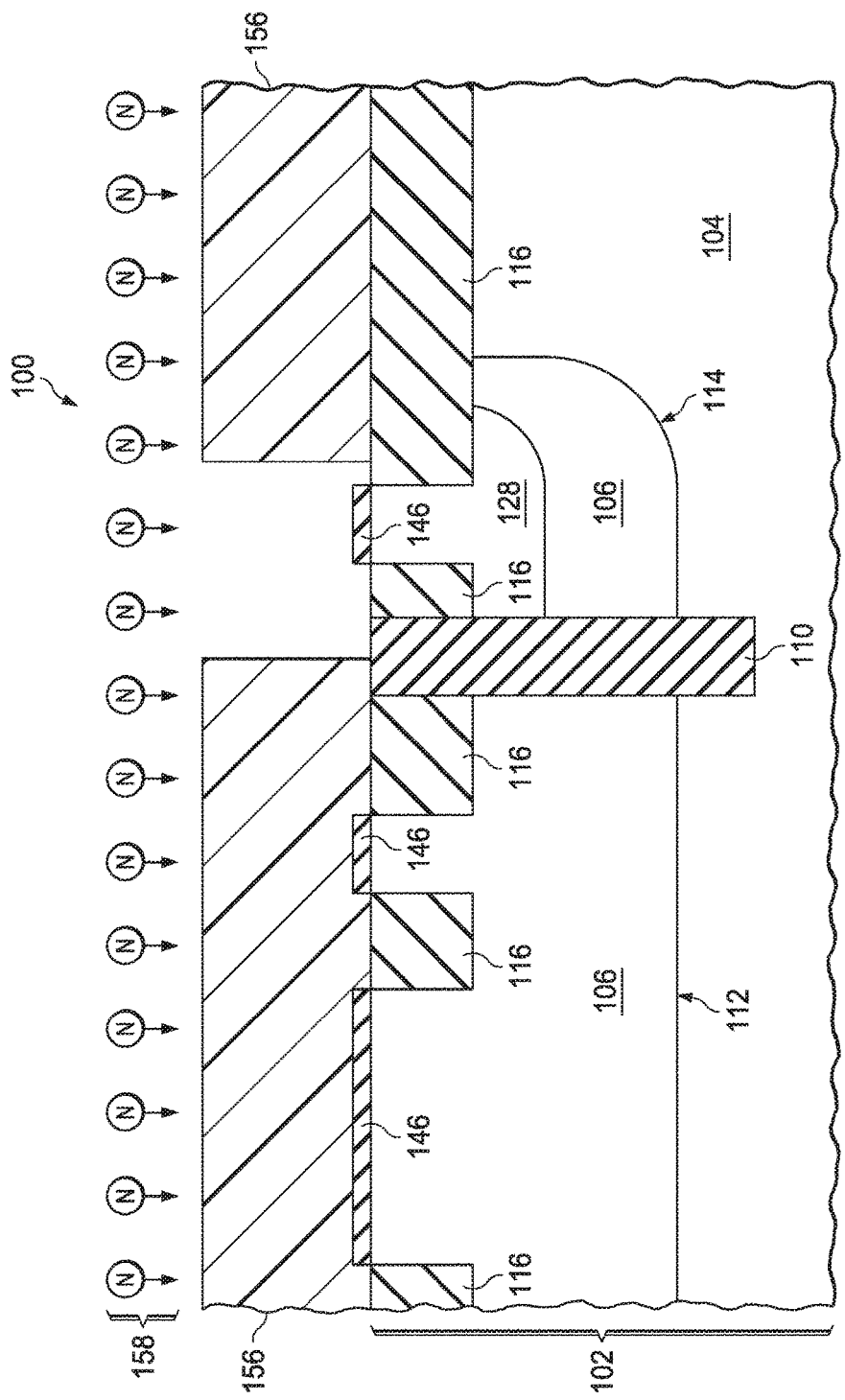

DEEP TRENCH ISOLATION WITH TANK CONTACT GROUNDING

CROSS-REFERENCE TO RELATED APPLICATIONS

This application is a divisional of U.S. patent application Ser. No. 14/101,435, filed Dec. 10, 2013, which claims the benefit of U.S. Provisional Application 61/747,080 filed Dec. 28, 2012, both of which are hereby incorporated by reference in their entirety.

FIELD OF THE INVENTION

This invention relates to the field of integrated circuits. More particularly, this invention relates to deep wells in integrated circuits.

BACKGROUND OF THE INVENTION

An integrated circuit includes a deep n-type well in a p-type substrate, for example to isolate a transistor in the deep well from the substrate. A deep isolation trench isolation is formed through the deep well to laterally isolate the transistor. The deep isolation trench separates a portion of the deep well from a main part of the deep well which contains the transistor; the separated portion contains no components of the integrated circuit. The separated portion of the deep well undesirably causes electrical interference with nearby circuit components.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit is formed on a substrate containing a semiconductor material having a first conductivity type. A deep well having a second, opposite, conductivity type is formed in the semiconductor material of the first conductivity type. A deep isolation trench is formed in the substrate through the deep well so as separate an unused portion of the deep well from a functional portion of the deep well. The functional portion of the deep well contains an active component of the integrated circuit. The separated portion of the deep well does not contain an active component. A contact region having the second conductivity type and a higher average doping density than the deep well is formed in the separated portion of the deep well. The contact region is connected to a voltage terminal of the integrated circuit.

DESCRIPTION OF THE VIEWS OF THE DRAWING

FIG. 2A through FIG. 2H are cross sections of the integrated circuit of FIG. 1, depicted in stages of fabrication.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit is formed on a substrate containing a semiconductor material having a first conductivity type. A deep well having a second, opposite, conductivity type is formed in the semiconductor material of the first conductivity type. A deep isolation trench is formed in the substrate through the deep well so as separate an unused portion of the deep well from a functional portion of the deep well. The functional portion of the deep well contains an active circuit element of the integrated circuit. The separated portion of the deep well does not contain an active circuit element. A contact region having the second conductivity type and a higher average doping density than the deep well is formed in the separated portion of the deep well. The contact region is connected to a voltage terminal of the integrated circuit.

The examples herein will describe integrated circuits with p-type semiconductor material in the substrates containing deep n-type wells. Analogous integrated circuits with n-type semiconductor material in the substrates containing p-type deep wells may be formed according to the examples with appropriate changes in dopant conductivity types.

Figure 1:
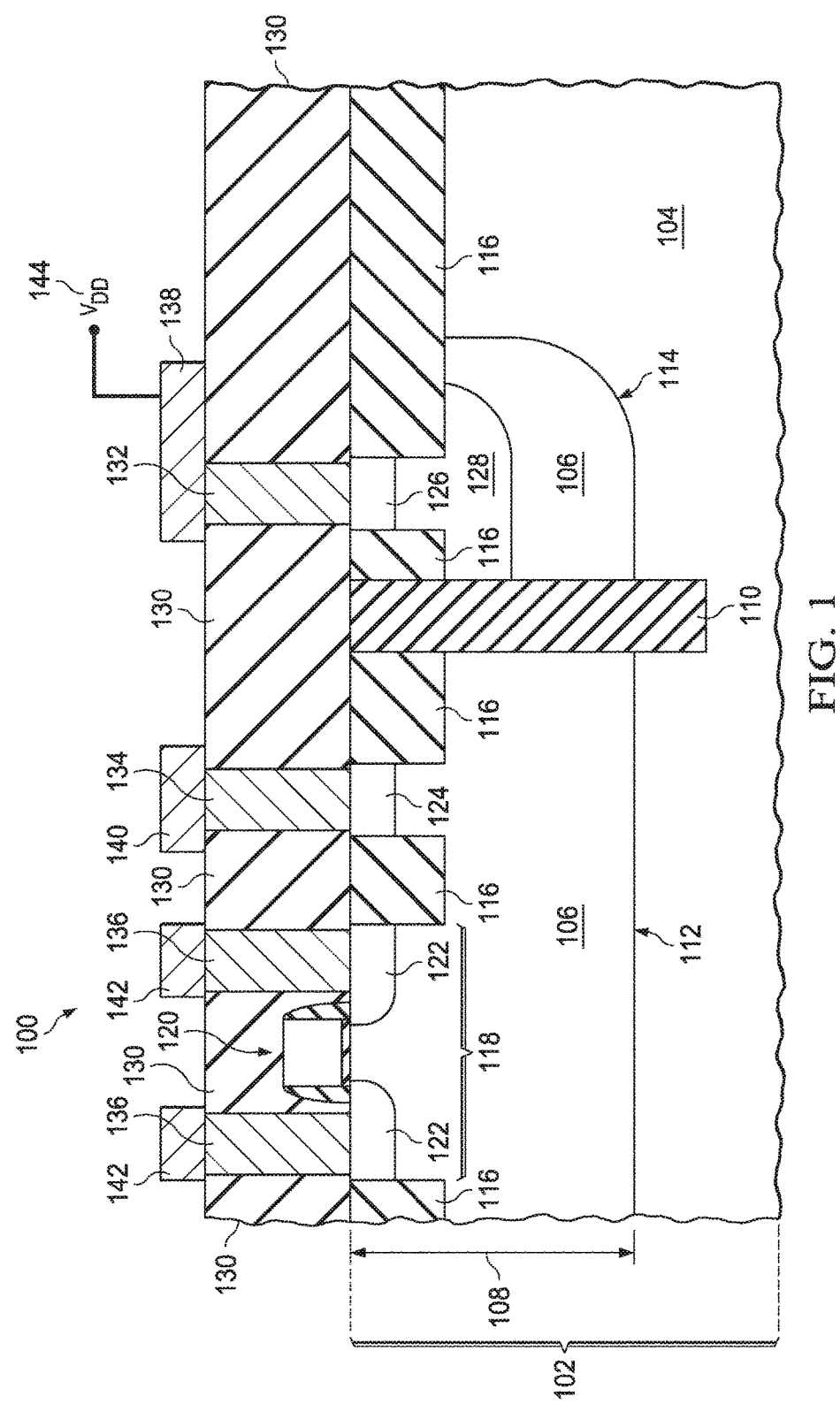
FIG. 1 is a cross section of an example integrated circuit.

FIG. 1 is a cross section of an example integrated circuit. The integrated circuit 100 is formed on a substrate 102 which may be a uniformly doped bulk silicon wafer, a heavily doped silicon wafer with a lightly doped epitaxial layer, a hybrid orientation technology (HOT) wafer with regions of different crystal orientations, or other material substrate for fabrication of the integrated circuit 100. The substrate 102 includes p-type semiconductor material 104, which may be p-type bulk material, p-type epitaxial material, or a p-type implanted region. The p-type semiconductor material 104 may have an average bulk resistivity of 10 ohm-cm to 100 ohm-cm. A deep n-type well 106 is disposed in the substrate 102, extending to a depth 108 of 1 micron to 5 microns. A deep isolation trench 110 is disposed in the substrate 102 through the deep n-type well 106 so as to separate a functional portion 112 of the deep n-type well 106 from a separated portion 114 of the deep n-type well 106. The deep isolation trench 110 includes dielectric material such as silicon dioxide so as to electrically isolate elements laterally abutting the deep isolation trench 110. In the instant example, the deep isolation trench 110 extends deeper into the substrate 102 than the deep n-type well 106. Field oxide 116 is disposed at a top surface of the substrate 102 to laterally isolate components. The field oxide 116 extends 300 nanometers to 600 nanometers deep into the substrate 102.

The functional portion 112 includes an active component 118 of the integrated circuit 100, depicted in the examples herein as a p-channel metal oxide semiconductor (PMOS) transistor 118, which includes a gate structure 120 and p-channel source and drain (PSD) regions 122. The functional portion 112 may also include an n-type well tap region 124.

The separated portion 114 of the deep n-type well 106 includes an n-type well contact region 126 in the substrate 102. The well contact region 126 may be laterally surrounded by the field oxide 116. The separated portion 114 may also include an optional shallow n-type well 128 under the well contact region 126. The separated portion 114 does not contain an active circuit element.

The integrated circuit 100 includes a pre-metal dielectric (PMD) layer 130 disposed over the substrate 102 and the active component 118. The PMD layer 130 may include a contact etch stop layer (CESL) of silicon nitride, a main layer of boron-phosphorus-silicate glass (BPSG) and possibly a cap layer of silicon dioxide and/or silicon nitride. Contacts are formed through the PMD layer 130 to make electrical connections to the components in the substrate 102. The contacts include a first well contact 132 on the well contact region 126 in the separated portion 114 of the deep n-type well 106. The contacts also include a second well contact 134 on the well tap region 124 in the functional portion 112 of the deep n-type well 106. The contacts further include component contacts 136 to the active component 118 in the functional portion 112. In the instant example, the component contacts 136 are disposed on the PSD regions 122. Metal interconnects formed over the PMD layer 130, making electrical connections to the contacts. The metal interconnects include a first metal interconnect 138 making a connection to the first well contact 132, a second metal interconnect 140 making a connection to the second well contact 134, and third metal interconnects 142 making connections to the component contacts 136. The first metal interconnect 138 is connected to a voltage terminal 144 of the integrated circuit 100; in the instant example, the voltage terminal 144 is a positive voltage supply terminal 144 labeled $V_{DD}$, as depicted schematically in FIG. 1. Other configurations for coupling the separated portion 114 of the deep n-type well 106 to the voltage terminal 144 are within the scope of the instant example.

During operation of the integrated circuit 100, the separated portion 114 of the deep n-type well 106 is maintained at a voltage provided by the voltage terminal 144 through the first metal interconnect 138 and the first well contact 132, and the shallow n-type well 128 if present. Maintaining the separated portion 114 at the voltage provided by the voltage terminal 144 may advantageously reduce interference by the separated portion 114 with other components in the integrated circuit 100, for example through capacitive coupling or charge exchange. The shallow n-type well 128 may advantageously provide a lower impedance connection to the separated portion 114, which may reduce voltage fluctuations from high frequency signals in the other components.

Figure 2A:
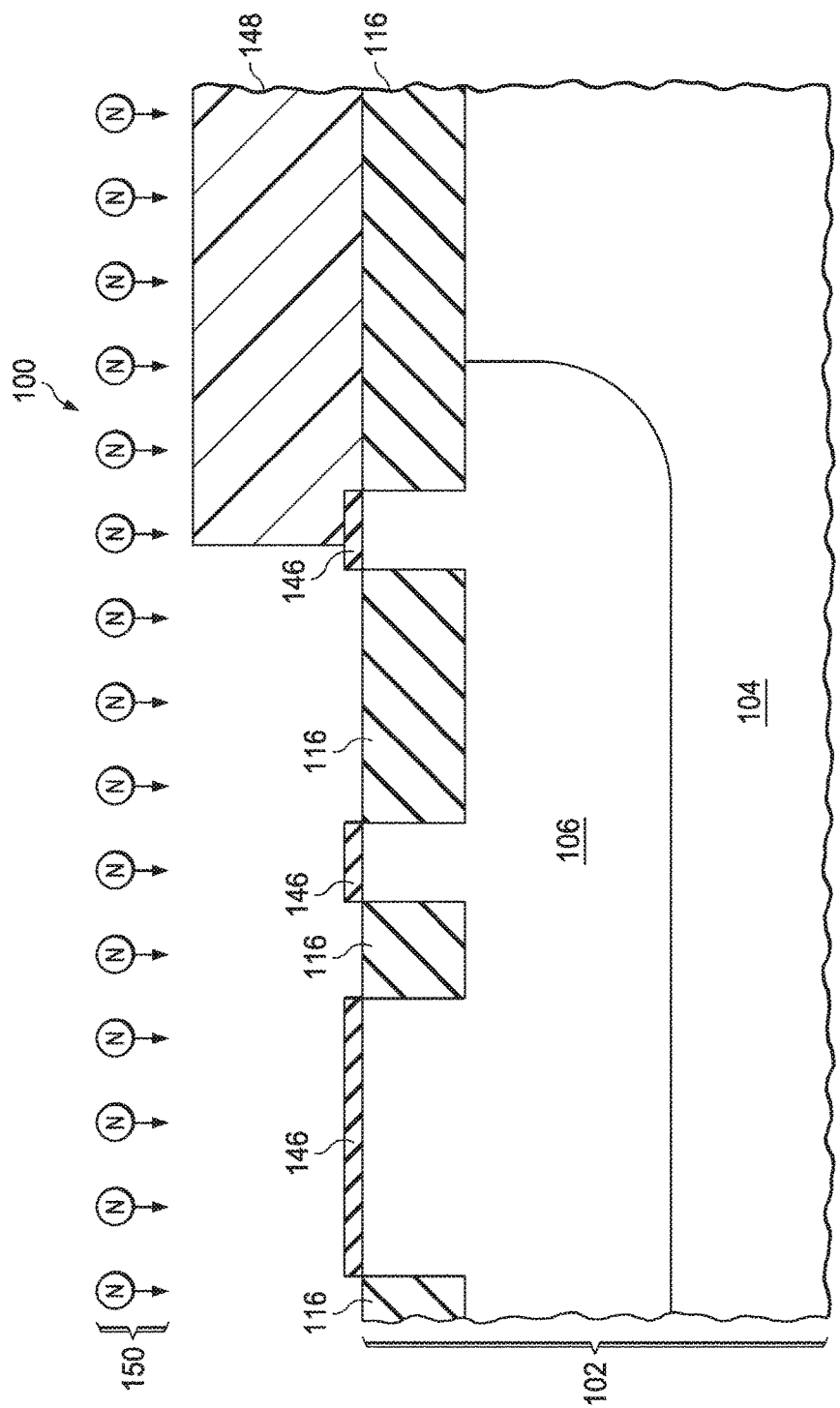

FIG. 2A through FIG. 2H are cross sections of the integrated circuit of FIG. 1, depicted in stages of fabrication. Referring to FIG. 2A, the field oxide 116 is formed at the top surface of the substrate 102. The field oxide 116 may be formed by a shallow trench isolation (STI) process or by a local oxidation of silicon (LOCOS) process. A layer of silicon dioxide 146, sometimes referred to as a layer of pad oxide 146, is formed over the substrate 102. The layer of pad oxide 146 may be 5 nanometers to 50 nanometers thick, and may be formed by thermal oxidation of silicon in the substrate 102, or by a plasma enhanced chemical vapor deposition (PECVD) process using tetraethyl orthosilicate, also known as tetraethoxysilane or TEOS.

A deep well mask 148 is formed over the substrate 102, the field oxide 116 and the layer of pad oxide 146 so as to expose an area for the deep n-type well 106. The deep well mask 148 may include photoresist and/or may include hard mask materials such as silicon dioxide and silicon nitride. N-type dopants 150 such as phosphorus are implanted into the substrate 102 in the area exposed by the deep well mask 148, for example at a dose of $1 \times 10^{12}$ cm$^{-2}$ to $5 \times 10^{12}$ cm$^{-2}$ at an energy of 1 MeV to 3 MeV. Subsequently, the deep well mask 148 is removed and the substrate 102 is annealed, for example at 1000° C. to 1150° C. for 1 hour to 4 hours, so as to diffuse and active the implanted n-type dopants 150 to form the deep n-type well 106 with an average doping density of $1 \times 10^{16}$ cm$^{-3}$ to $3 \times 10^{16}$ cm$^{-3}$.

Figure 2B:
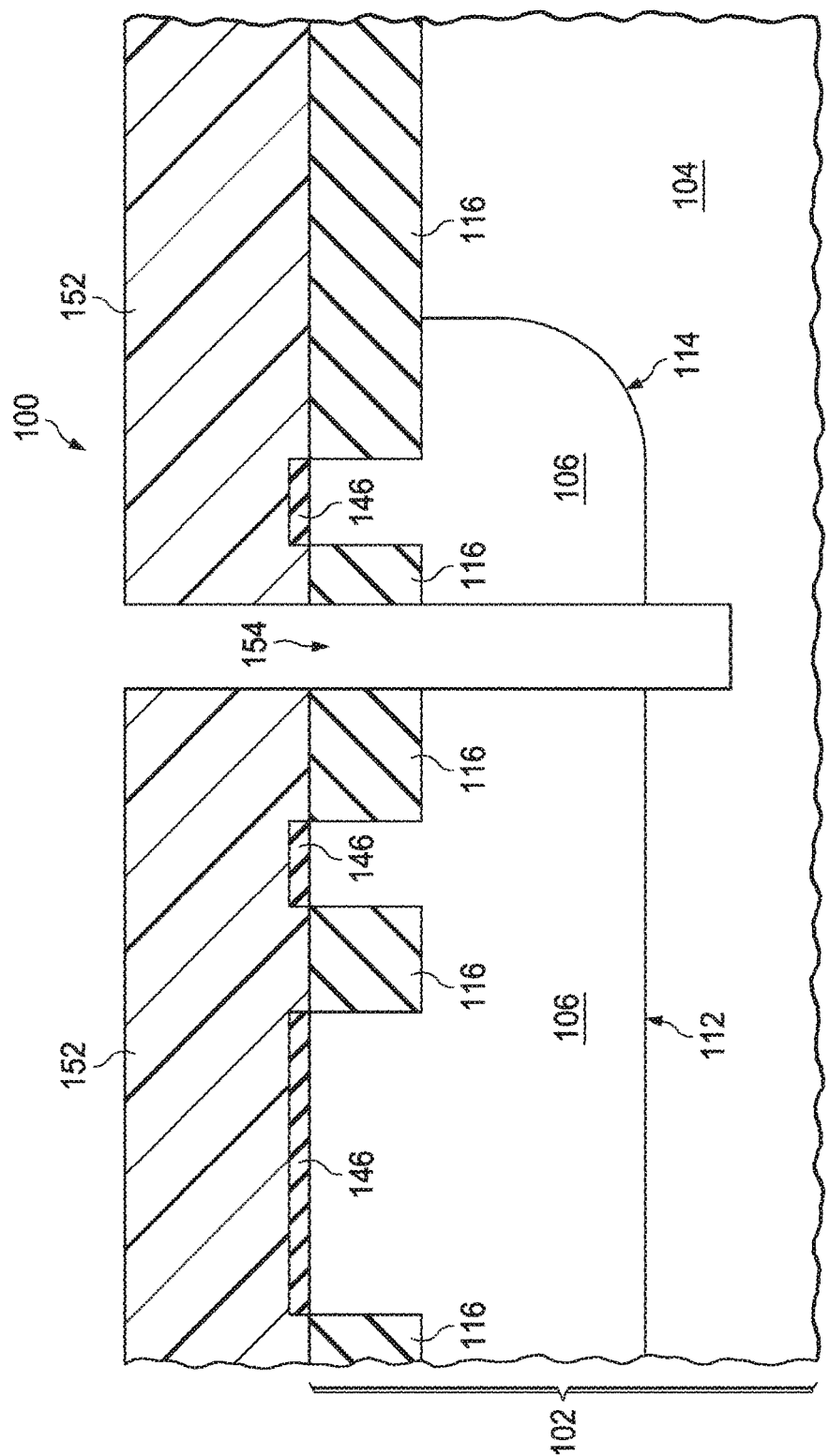

Referring to FIG. 2B, after the deep n-type well 106 is formed, a trench mask 152 is formed over the substrate 102 and the field oxide 116 so as to expose an area for the deep isolation trench 110 of FIG. 1. The trench mask 152 may include photoresist and/or may include hard mask materials such as silicon dioxide, silicon nitride, silicon carbide and amorphous carbon. A trench etch process is performed which removes material from the field oxide 116 and the substrate 102 to form a deep trench opening 154 in the substrate 102 through the deep n-type well 106. The trench etch process may include an iterative sequence of passivating existing sidewalls of the deep trench opening 154 and etching material from an existing bottom of the deep trench opening 154 as in the Bosch etch process. Alternatively, the trench etch process may be a continuous process which passivates the sidewalls while simultaneously removing material from the bottom. The deep trench opening 154 is deeper than the deep n-type well 106 so that the deep trench opening 154 divides the deep n-type well 106 into the functional portion 112 and the separated portion 114. The field oxide 116 includes an opening, commonly referred to as an active area, in the separated portion 114 for the well contact region 126 of FIG. 1. After, or while, the deep trench opening 154 is formed, at least a portion of the trench mask 152 is removed before the deep trench opening 154 is subsequently filled.

Figure 2C:
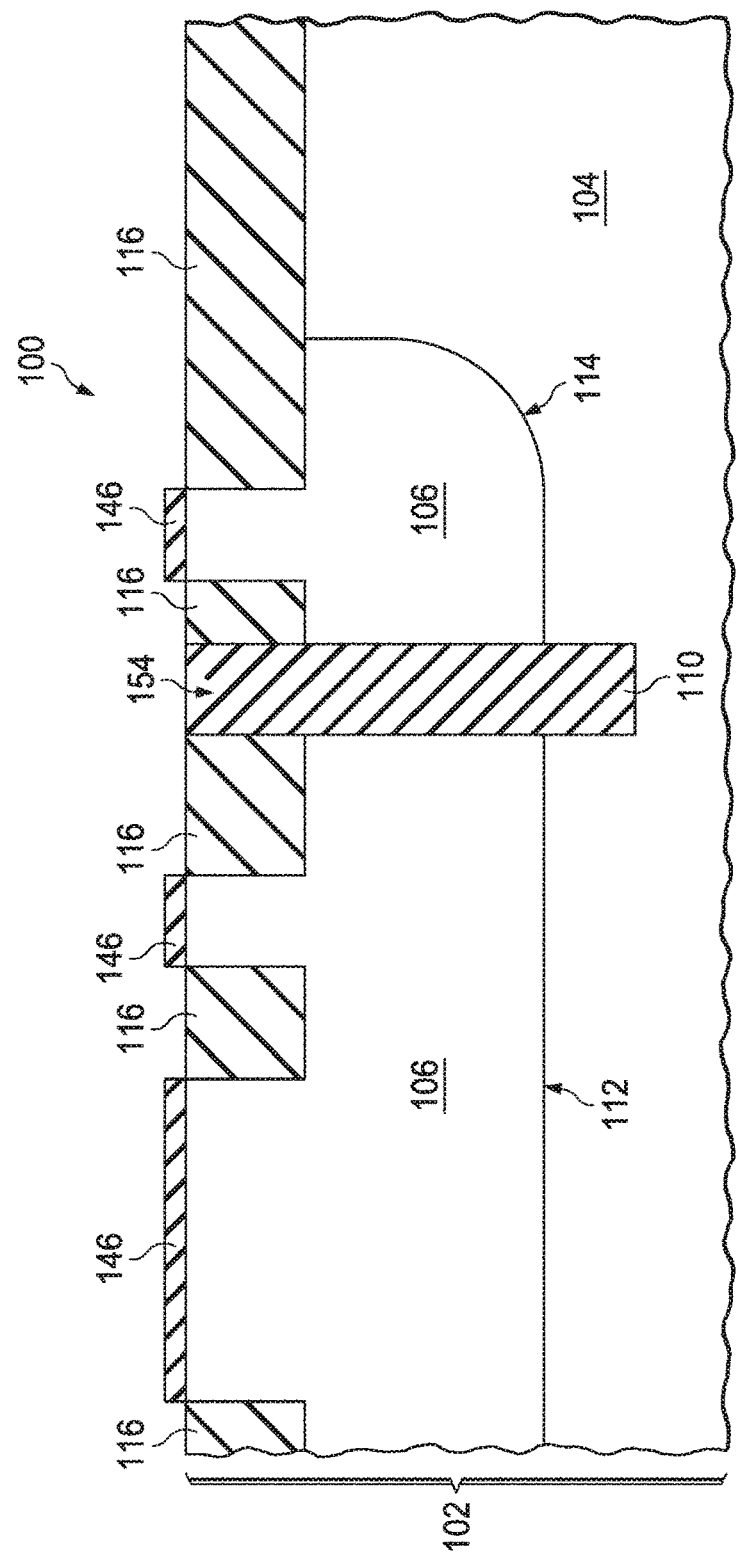

Referring to FIG. 2C, dielectric material such as silicon dioxide is formed in the deep trench opening 154 to form the deep isolation trench 110. In some versions of the instant example, the dielectric material may be formed on sidewalls of the deep trench opening 154 and electrically conductive material such as polycrystalline silicon may be formed on the dielectric material to provide a field plate in the deep isolation trench 110. Remaining material from the trench mask 152 of FIG. 2B is subsequently removed.

Referring to FIG. 2D, an optional shallow n-type well mask 156 may be formed over the substrate 102 and the field oxide 116 so as to expose an area in the separated portion 114 of the deep n-type well 106 for the shallow n-type well 128. The shallow n-type well mask 156 may include thick photoresist. The shallow n-type well mask 156 may expose the substrate 102 in other areas for other shallow n-type wells in the integrated circuit 100, for example to provide body regions for PMOS transistors. N-type dopants 158 such as phosphorus are implanted into the substrate 102 in the area exposed by the shallow n-type well mask 156, for example at a dose of $2 \times 10^{13}$ cm$^{-2}$ to $1 \times 10^{14}$ cm$^{-2}$ at an energy of 400 keV to 1 MeV. Subsequently, the shallow n-type well mask 156 is removed and the substrate 102 is annealed so as to diffuse and active the implanted n-type dopants 158 to form the optional shallow n-type well 128 with an average doping density of $1 \times 10^{18}$ cm$^{-3}$ to $3 \times 10^{18}$ cm$^{-3}$.

Figure 2E:
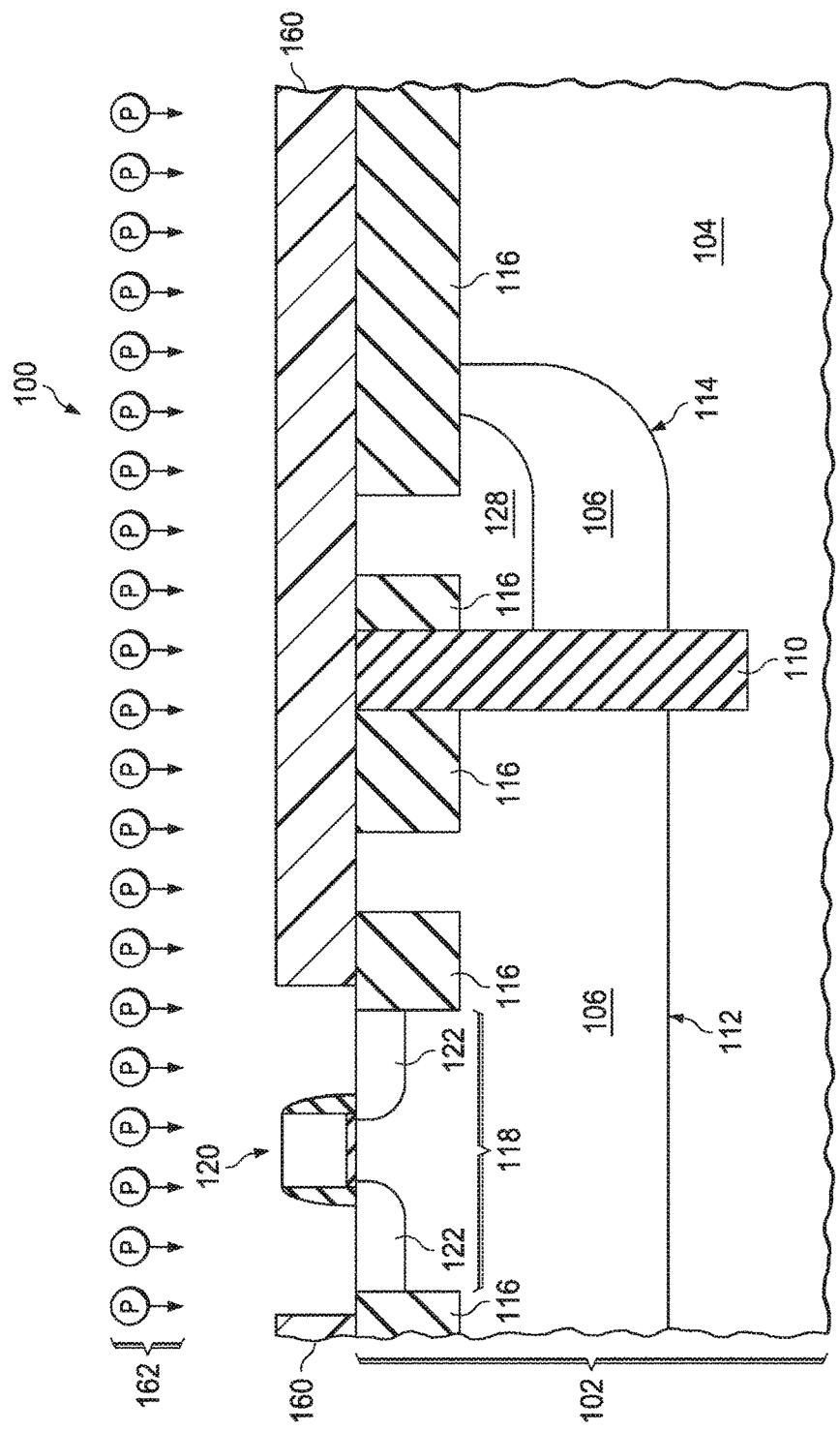

Referring to FIG. 2E, the gate structure 120 of the PMOS transistor 118 is formed on the substrate 102 over the functional portion 112 of the deep n-type well 106. A PSD mask 160 is formed over an existing top surface of the integrated circuit 100 so as to expose an area for the PSD regions 122 of the PMOS transistor 118. The PSD mask 160 may expose areas for p-type substrate contact regions and p-type well tap regions in other areas of the integrated circuit 100. In the instant example, the PSD mask 160 does not expose an area over the separated portion 114 of the deep n-type well 106. P-type dopants 162 such as boron, BF$_2$, and possibly gallium or indium, are implanted into the substrate 102 in the areas exposed by the PSD mask 160, including adjacent to the gate structure 120, at a dose of $5 \times 10^{14}$ cm$^{-2}$ to $1 \times 10^{16}$ cm$^{-2}$ at an energy of 5 keV to 20 keV. The PSD mask 160 is subsequently removed and the substrate is annealed to activate the implanted p-type dopants 162 to form the PSD regions 122.

Figure 2F:
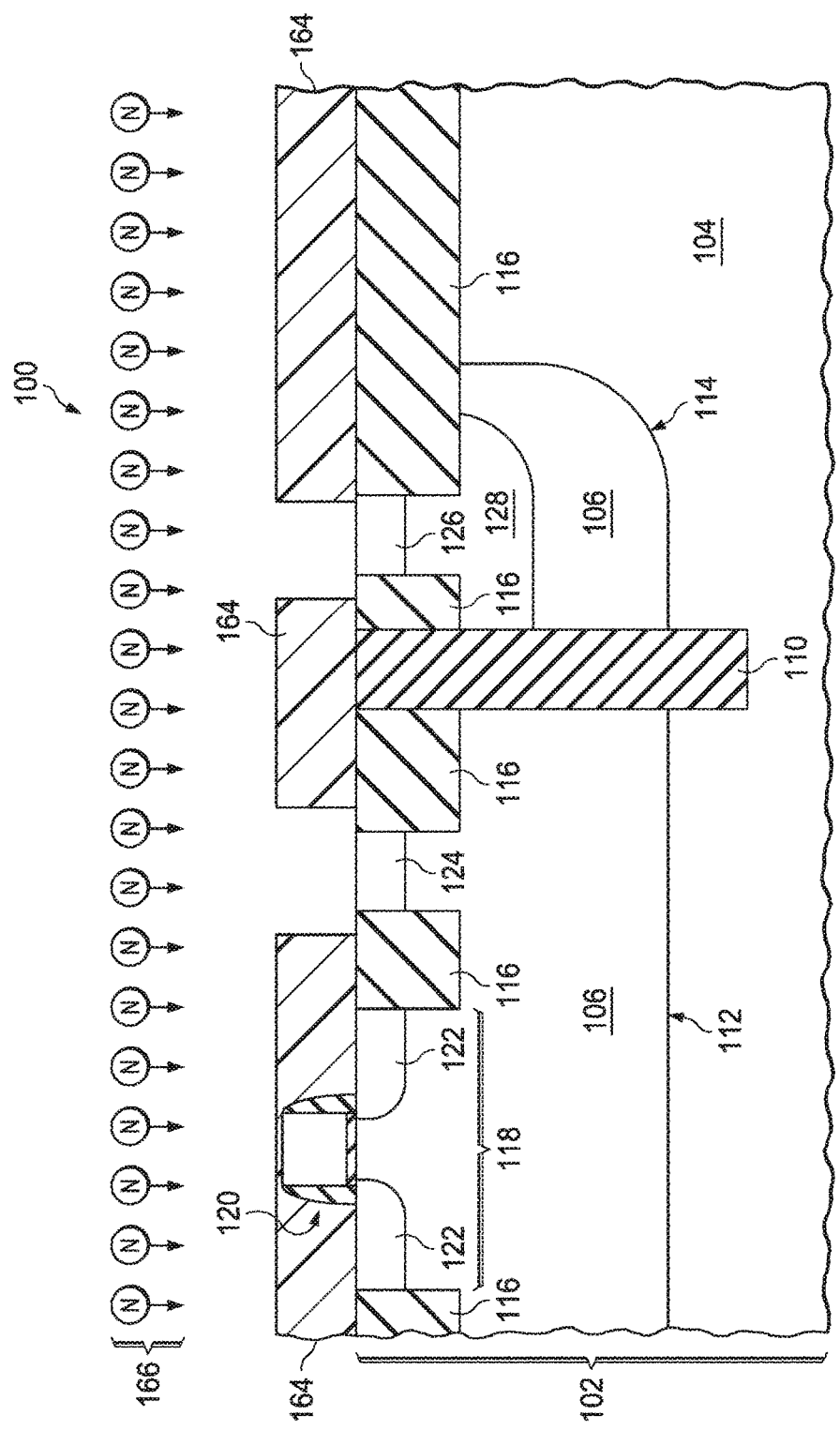

Referring to FIG. 2F, an n-channel source and drain (NSD) mask 164 is formed over an existing top surface of the integrated circuit 100 so as to expose an area for the n-type well tap region 124 in the functional portion 112 of the deep n-type well 106 and for the n-type well contact region 126 in the separated portion 114. The NSD mask 164 may expose areas for NSD regions of n-channel metal oxide semiconductor (NMOS) transistors in other areas of the integrated circuit 100. N-type dopants 166 such as phosphorus and arsenic and possibly antimony are implanted into the substrate 102 in the areas exposed by the NSD mask 164, including the areas for the well tap region 124 and the well contact region 126, at a dose of $5 \times 10^{14}$ cm$^{-2}$ to $1 \times 10^{16}$ cm$^{-2}$ at an energy of 40 keV to 100 keV. The NSD mask 164 is subsequently removed and the substrate is annealed to activate the implanted n-type dopants 166 to form the well tap region 124 and the well contact region 126. A portion or all of the anneal process for the implanted p-type dopants 162 of FIG. 2E and the implanted n-type dopants 166 may be performed concurrently.

Figure 2G:
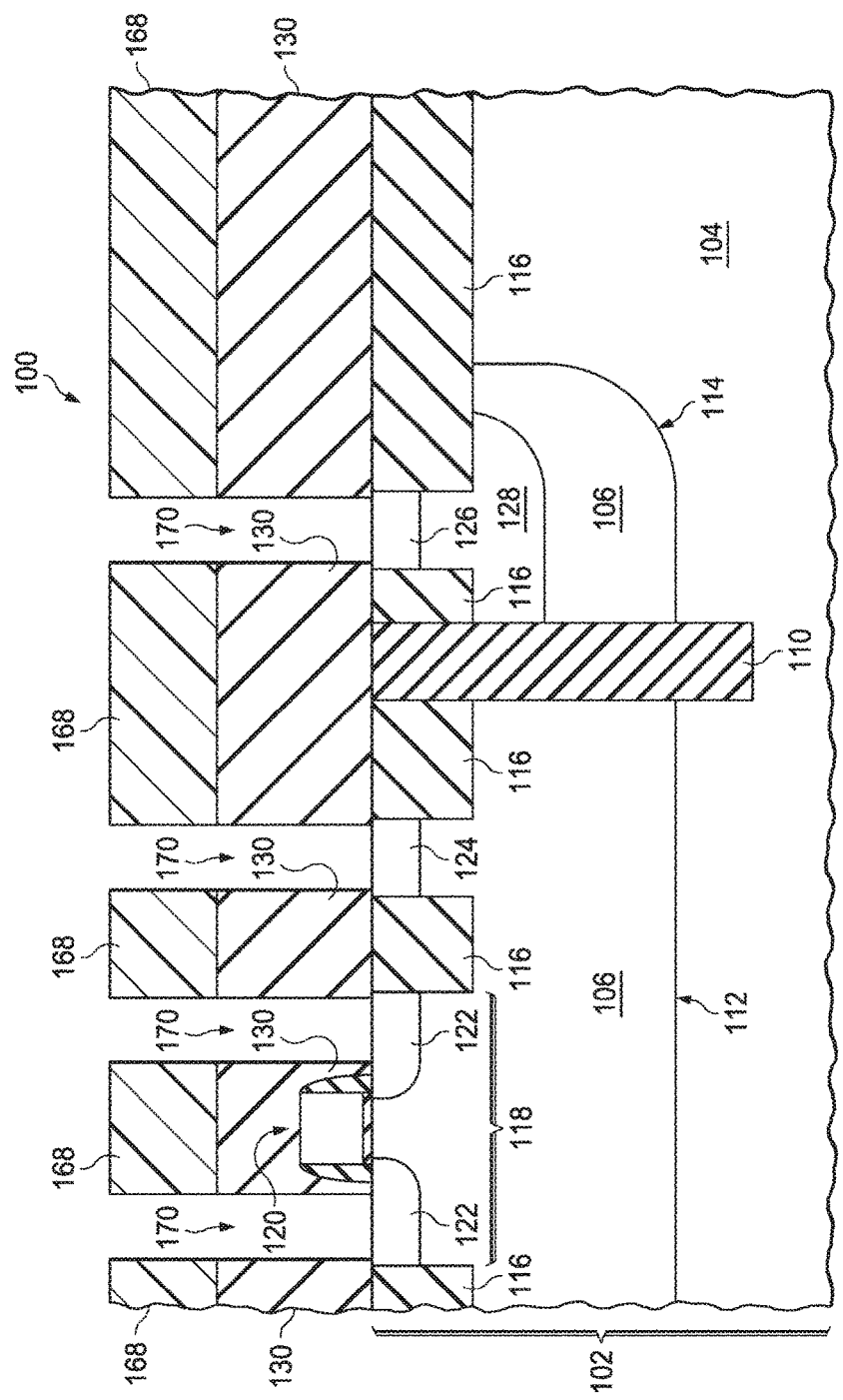

Referring to FIG. 2G, the PMD layer 130 is formed over an existing top surface of the integrated circuit 100. The PMD layer 130 may be formed by a series of PECVD processes to produce the CESL layer, the main layer and/or the cap layer. A contact mask 168 is formed over the PMD layer 130 so as to expose areas for contacts, including over the PSD regions 122, the well tap region 124 and the well contact region 126. A contact etch process is performed which removes dielectric material from the PMD layer 130 to form contact holes 170 which expose the substrate 102. The contact mask 168 is removed before contact metal is formed in the contact holes 170.

Figure 2H:
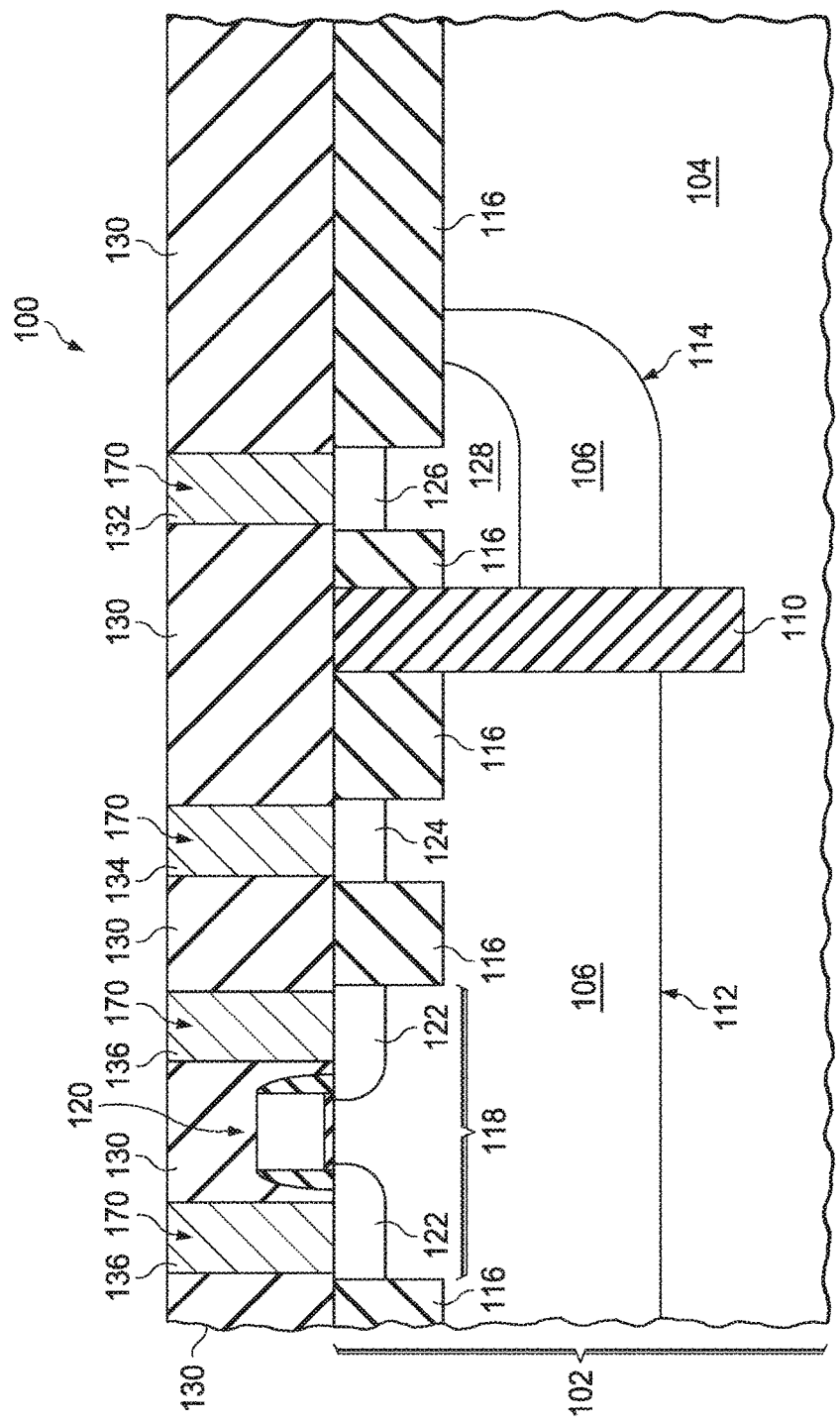

Referring to FIG. 2H, contact metal is formed in the contact holes 170 and over the PMD layer 130 so as to make electrical connection to the substrate 102. The contact metal may include an adhesion layer of titanium, a barrier layer of titanium nitride and a fill layer of tungsten. The contact metal is removed from over a top surface of the PMD layer 130 by a chemical mechanical polish (CMP) process and/or an etchback process, to leave the first well contact 132 on the well contact region 126, the second well contact 134 on the well tap region 124, and the component contacts 136 on the PSD regions 122. Metal interconnects are subsequently formed over the PMD layer 130 to make electrical connections to the first well contact 132, the second well contact 134 and the component contacts 136 to provide the structure of FIG. 1. Forming the well contact region 126, the shallow n-type well 128 and the first well contact 132 concurrently with other similar elements of the integrated circuit 100 may advantageously simplify a fabrication process sequence and reduce a fabrication cost of the integrated circuit 100. Other methods for coupling the separated portion 114 of the deep n-type well 106 to the voltage terminal 144 are within the scope of the instant example.

Figure 3:
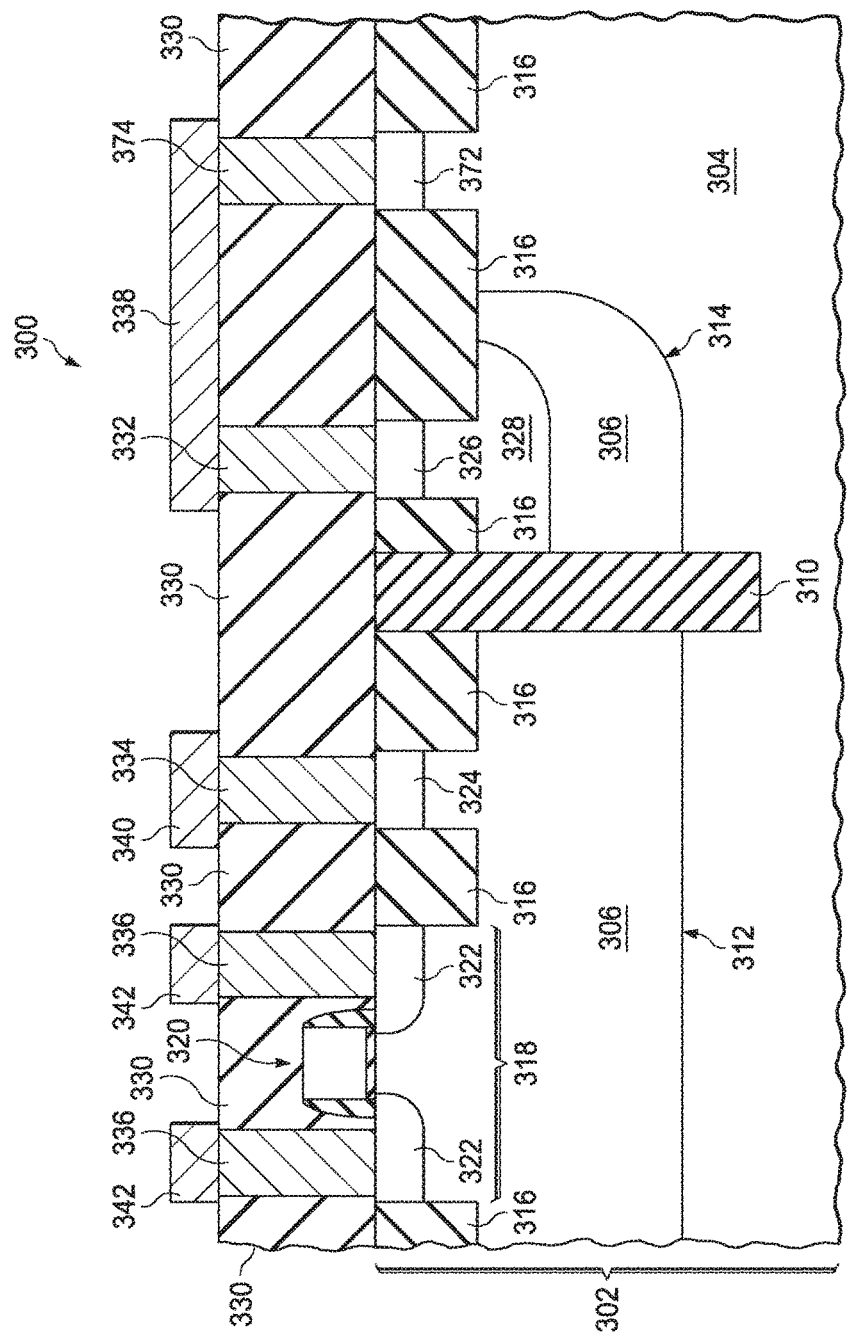
FIG. 3 is a cross section of another example integrated circuit.

FIG. 3 is a cross section of another example integrated circuit. The integrated circuit 300 is formed on a substrate 302, for example as described in reference to FIG. 1. The substrate 302 includes p-type semiconductor material 304. A deep n-type well 306 is disposed in the substrate 302, extending to a depth 308 of 1 micron to 5 microns. A deep isolation trench 310 is disposed in the substrate 302 through the deep n-type well 306 so as to separate a functional portion 312 of the deep n-type well 306 from a separated portion 314. In the instant example, the deep isolation trench 310 extends deeper into the substrate 302 than the deep n-type well 306. Field oxide 316 is disposed at a top surface of the substrate 302, extending 300 nanometers to 600 nanometers deep, to laterally isolate components.

The functional portion 312 includes an active component 318 of the integrated circuit 300, depicted as a PMOS transistor 318, which includes a gate structure 320 and PSD regions 322. The functional portion 312 may also include an n-type well tap region 324. The separated portion 314 of the deep n-type well 306 includes an n-type well contact region 326 in the substrate 302. The separated portion 314 may also include a shallow n-type well 328 under the well contact region 326. The separated portion 314 does not contain an active circuit element. A p-type substrate tap region 372 is formed in the substrate 302 adjacent to the separated portion 314 of the deep n-type well 306 and proximate to the n-type well contact region 326. In the instant example, the p-type substrate tap region 372 is laterally separated from the n-type well contact region 326 by field oxide 316. The PSD regions 322 and the p-type substrate tap region 372 may be formed concurrently as described in reference to FIG. 2E. The n-type well tap region 324 and the n-type well contact region 326 may be formed concurrently as described in reference to FIG. 2F.

A PMD layer 330 is formed over an existing top surface of the integrated circuit 300, as described in reference to FIG. 1 and FIG. 2G. Contacts are formed through the PMD layer 330 to make electrical connections to the components in the substrate 302. The contacts include a first well contact 332 on the well contact region 326 in the separated portion 314 of the deep n-type well 306, a second well contact 334 on the well tap region 324 in the functional portion 312 of the deep n-type well 306, and component contacts 336 to the PSD regions 322. The contacts also include a substrate tap contact 374 to the p-type substrate tap region 372 adjacent to the separated portion 314 of the deep n-type well 306.

Metal interconnects formed over the PMD layer 330, making electrical connections to the contacts. The metal interconnects include a first metal interconnect 338 making a connection to the first well contact 332 and to the substrate tap contact 374, which connects the separated portion 314 of the deep n-type well 306 to the voltage terminal, which in the instant example is a ground voltage terminal comprised of the substrate 302. Connecting the separated portion 314 to the substrate 302 as described in the instant example may advantageously simplify a layout of the integrated circuit 300 and thus reduce the fabrication cost. The metal interconnects also include a second metal interconnect 340 making a connection to the second well contact 334, and third metal interconnects 342 making connections to the component contacts 336. Other configurations for coupling the separated portion 314 of the deep n-type well 306 to the ground voltage terminal are within the scope of the instant example.

Figure 4:
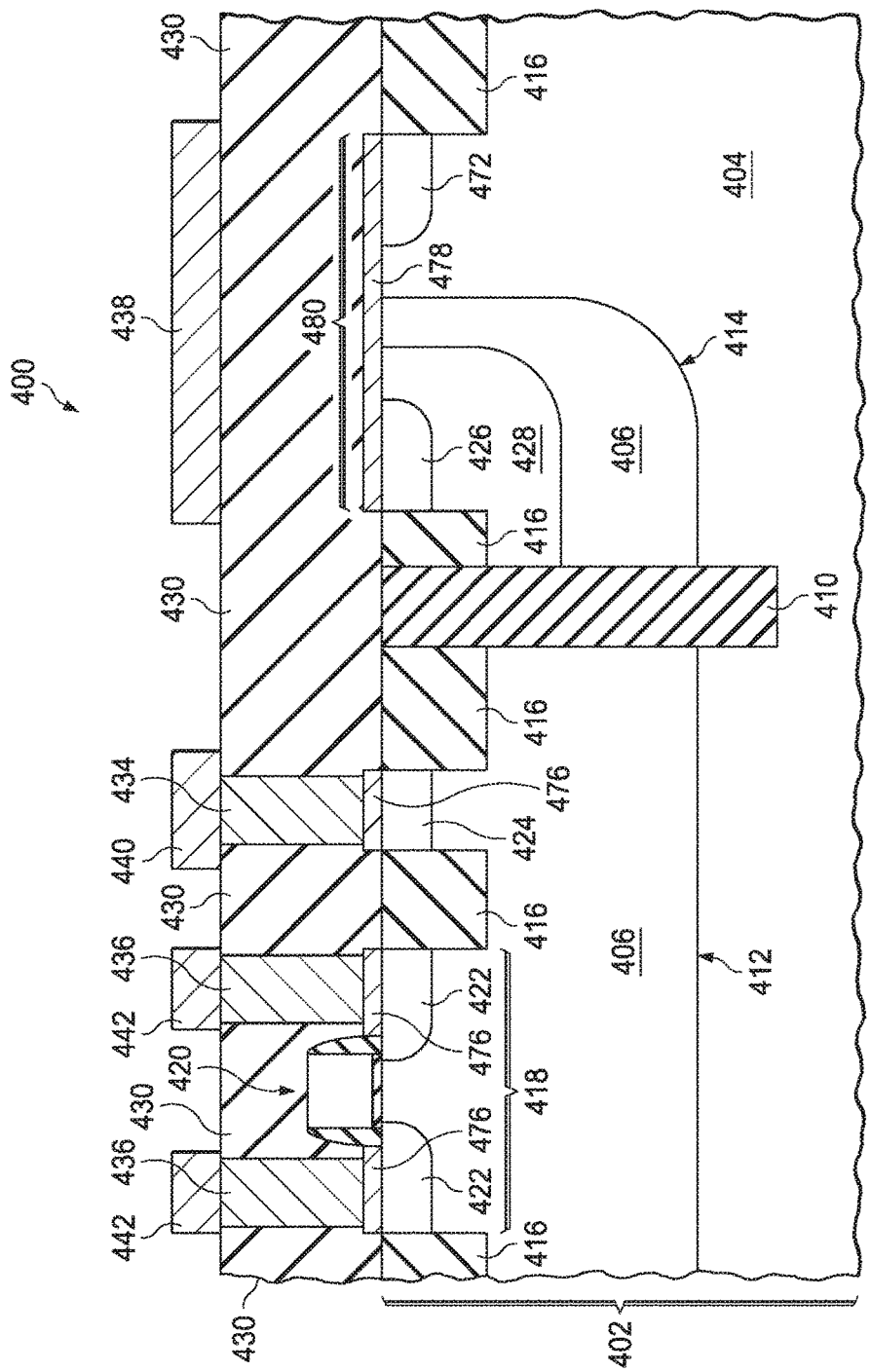
FIG. 4 is a cross section of a further example integrated circuit.

FIG. 4 is a cross section of a further example integrated circuit. The integrated circuit 400 is formed on a substrate 402, for example as described in reference to FIG. 1. The substrate 402 includes p-type semiconductor material 404. A deep n-type well 406 is disposed in the substrate 402, extending to a depth 408 of 1 micron to 5 microns. A deep isolation trench 410 is disposed in the substrate 402 through the deep n-type well 406 so as to separate a functional portion 412 of the deep n-type well 406 from a separated portion 414. Field oxide 416 is disposed at a top surface of the substrate 402, extending 300 nanometers to 600 nanometers deep, to laterally isolate components.

The functional portion 412 includes an active component 418 of the integrated circuit 400, depicted as a PMOS transistor 418, which includes a gate structure 420 and PSD regions 422. The functional portion 412 may also include an n-type well tap region 424.

The separated portion 414 of the deep n-type well 406 includes an n-type well contact region 426 in the substrate 402. The separated portion 414 may also include a shallow n-type well 428 under the well contact region 426. The separated portion 414 does not contain an active circuit element. A p-type substrate tap region 472 is formed in the substrate 402 adjacent to the separated portion 414 of the deep n-type well 406 and proximate to the n-type well contact region 426. In the instant example, the p-type substrate tap region 472 and the n-type well contact region 426 are in a same active area 480 in the field oxide 416. The PSD regions 422 and the p-type substrate tap region 472 may be formed concurrently as described in reference to FIG. 2E. The n-type well tap region 424 and the n-type well contact region 426 may be formed concurrently as described in reference to FIG. 2F.

Metal silicide is formed on exposed semiconductor material at the top surface of the substrate 402, including contact silicide 476 on the PSD regions 422 and the well tap region 424, and shunt silicide 478 on the active area 480 containing the p-type substrate tap region 472 and the n-type well contact region 426. The shunt silicide 478 electrically connects the separated portion 414 of the deep n-type well 406 to the voltage terminal comprised of the substrate 402. The contact silicide 476 and the shunt silicide 478 are formed concurrently, for example by depositing a layer of refractory metal, such as titanium, cobalt or nickel, on a top surface of the substrate 402, heating the substrate 402 to react a portion of the refractory metal with exposed silicon in exposed areas of the substrate 402, and selectively removing unreacted metal from the substrate 402 surface by exposing the substrate 402 to wet etchants including a mixture of an acid and hydrogen peroxide.

A PMD layer 430 is formed over an existing top surface of the integrated circuit 400, as described in reference to FIG. 1 and FIG. 2G. Contacts are formed through the PMD layer 430 to make electrical connections to the components in the substrate 402. The contacts include a well contact 434 on the contact silicide 476 on the well tap region 424 in the functional portion 412 of the deep n-type well 406, and component contacts 436 on the contact silicide 476 on the PSD regions 422. In the instant example, no contact is formed to the separated portion 414 of the deep n-type well 406. Other configurations for coupling the separated portion 414 of the deep n-type well 406 to the ground voltage terminal are within the scope of the instant example.

Metal interconnects formed over the PMD layer 430, making electrical connections to the contacts. The metal interconnects may include a first metal interconnect 438 over, but not connected to, the separated portion 414 of the deep n-type well 406. Connecting the separated portion 414 to the substrate 402 using the shunt silicide 478 may advantageously simplify a layout of the integrated circuit 400 by enabling metal interconnects to be formed over the separated portion 414 without interference, and thus reduce the fabrication cost. The metal interconnects also include a second metal interconnect 440 making a connection to the well contact 434, and third metal interconnects 442 making connections to the component contacts 436.

Figure 5:
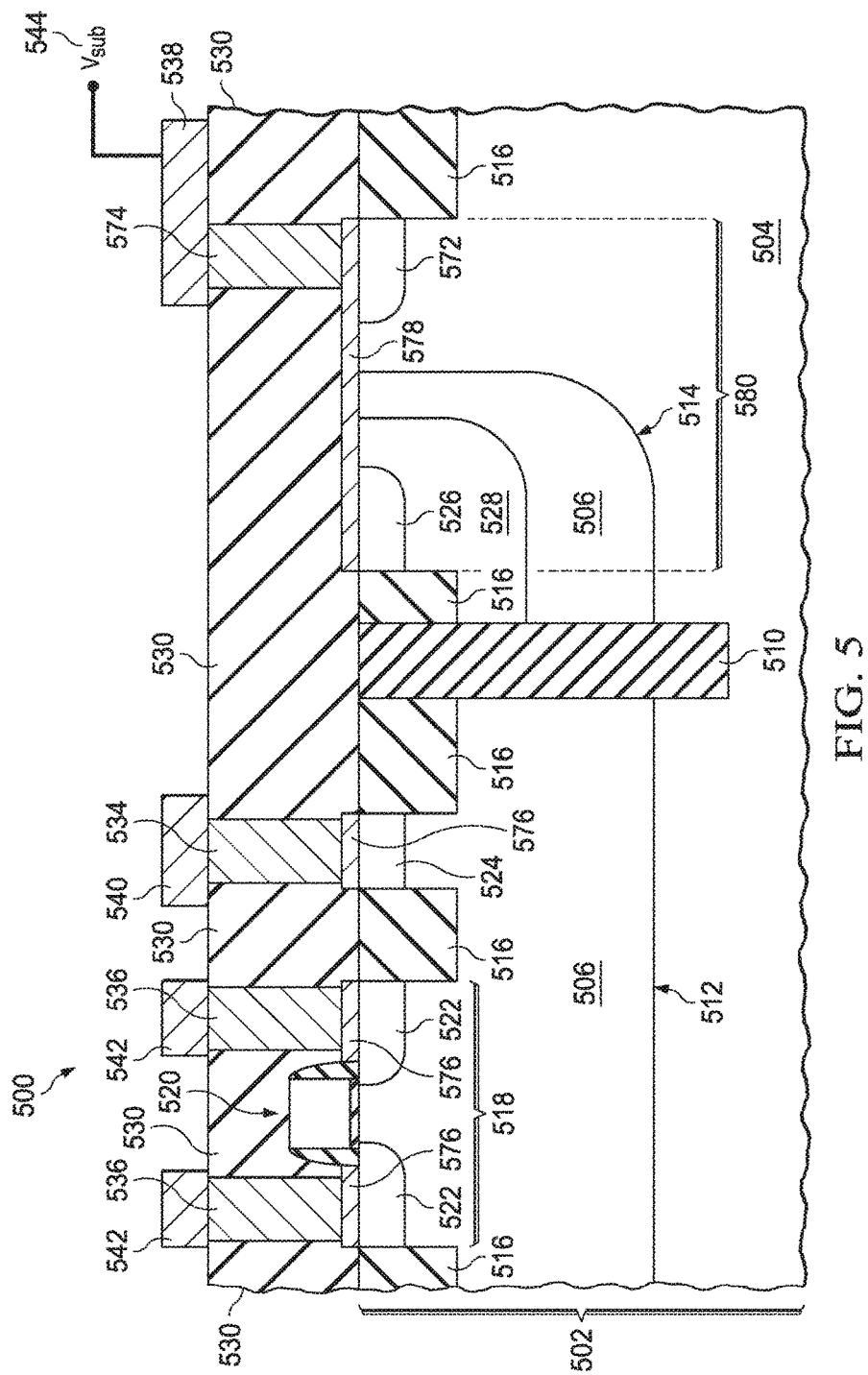
FIG. 5 is a cross section of yet another example integrated circuit.

FIG. 5 is a cross section of yet another example integrated circuit. The integrated circuit 500 is formed on a substrate 502, for example as described in reference to FIG. 1. The substrate 502 includes p-type semiconductor material 504. A deep n-type well 506 is disposed in the substrate 502, extending to a depth 508 of 1 micron to 5 microns. A deep isolation trench 510 is disposed in the substrate 502 through the deep n-type well 506 so as to separate a functional portion 512 of the deep n-type well 506 from a separated portion 514. Field oxide 516 is disposed at a top surface of the substrate 502, extending 300 nanometers to 600 nanometers deep, to laterally isolate components.

The functional portion 512 includes an active component 518 of the integrated circuit 500, depicted as a PMOS transistor 518, which includes a gate structure 520 and PSD regions 522. The functional portion 512 may also include an n-type well tap region 524. The separated portion 514 of the deep n-type well 506 includes an n-type well contact region 526 in the substrate 502. The separated portion 514 may also include a shallow n-type well 528 under the well contact region 526. The separated portion 514 does not contain an active circuit element. A p-type substrate tap region 572 is formed in the substrate 502 adjacent to the separated portion 514 of the deep n-type well 506 and proximate to the n-type well contact region 526. In the instant example, the p-type substrate tap region 572 and the n-type well contact region 526 are in a same active area 580 in the field oxide 516. Metal silicide is formed on exposed semiconductor material at the top surface of the substrate 502, including contact silicide 576 on the PSD regions 522 and the well tap region 524, and shunt silicide 578 on the active area 580 containing the p-type substrate tap region 572 and the n-type well contact region 526. The shunt silicide 578 electrically connects the separated portion 514 of the deep n-type well 506 to the substrate 502. The contact silicide 576 and the shunt silicide 578 may be formed concurrently.

A PMD layer 530 is formed over an existing top surface of the integrated circuit 500, as described in reference to FIG. 1 and FIG. 2G. Contacts are formed through the PMD layer 530 to make electrical connections to the components in the substrate 502. The contacts include a well contact 534 on the contact silicide 576 on the well tap region 524 in the functional portion 512 of the deep n-type well 506, and component contacts 536 on the contact silicide 576 on the PSD regions 522. The contacts also include a substrate tap contact 574 to the shunt silicide 578 on the p-type substrate tap region 572 and the n-type well contact region 526.

Metal interconnects formed over the PMD layer 530, making electrical connections to the contacts. The metal interconnects include a first metal interconnect 538 connected to the substrate tap contact 574. The first metal interconnect 538 is connected to a voltage terminal 544 of the integrated circuit 500; in the instant example, the voltage terminal 544 is a substrate node 544 labeled $V_{SUB}$, as depicted schematically in FIG. 5. Combining a connection to the separated portion 514 of the deep n-type well 506 with a substrate tap to the substrate 502 using the shunt silicide 578 may advantageously simplify a layout of the integrated circuit 500 and thus reduce the fabrication cost. The metal interconnects also include a second metal interconnect 540 making a connection to the well contact 534, and third metal interconnects 542 making connections to the component contacts 536. Other configurations for coupling the separated portion 514 of the deep n-type well 506 to the voltage terminal 544 are within the scope of the instant example.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a substrate comprising a semiconductor material of a first conductivity type;
a deep well of a second, opposite, conductivity type disposed in said semiconductor material of said substrate;
a deep isolation trench disposed through said deep well and into a portion of the substrate comprising a semiconductor material of said first conductivity type, so as to separate a functional portion of said deep well from a separated portion of said deep well, said separated portion being free of an active component of said integrated circuit;
an active component of said integrated circuit in said functional portion; and
a well contact region of said second conductivity type in said separated portion, said well contact region being connected to a voltage terminal of said integrated circuit.

2. The integrated circuit of claim 1, wherein said voltage terminal is a positive voltage supply terminal.

3. The integrated circuit of claim 1, wherein said voltage terminal is a ground voltage terminal comprised of said substrate.

4. The integrated circuit of claim 1, further comprising:
a well contact making an electrical connection to said well contact region; and
a metal interconnect making an electrical connection to said well contact, said metal interconnect being connected to said voltage terminal.

5. An integrated circuit, comprising:
a substrate comprising a semiconductor material of a first conductivity type;
a deep well of a second, opposite, conductivity type disposed in said semiconductor material of said substrate;
a deep isolation trench disposed through said deep well, so as to separate a functional portion of said deep well from a separated portion of said deep well, said separated portion being free of an active component of said integrated circuit;
an active component of said integrated circuit in said functional portion;
a well contact region of said second conductivity type in said separated portion, said well contact region being connected to a voltage terminal of said integrated circuit;
a substrate tap region of said first conductivity type in said substrate adjacent to said separated portion and proximate to said well contact region; and
a well contact making an electrical connection to said well contact region;
a substrate tap contact making an electrical connection to said substrate tap region; and
a metal interconnect making an electrical connection to said well contact and said substrate tap contact.

6. An integrated circuit, comprising:
a substrate comprising a semiconductor material of a first conductivity type;
a deep well of a second, opposite, conductivity type disposed in said semiconductor material of said substrate;
a deep isolation trench disposed through said deep well, so as to separate a functional portion of said deep well from a separated portion of said deep well, said separated portion being free of an active component of said integrated circuit;
an active component of said integrated circuit in said functional portion;
a well contact region of said second conductivity type in said separated portion, said well contact region being connected to a voltage terminal of said integrated circuit;
a substrate tap region of said first conductivity type in said substrate adjacent to said separated portion and proximate to said well contact region, said substrate tap region and said well contact region being in a same active area; and
metal silicide on said active area containing said substrate tap region and said well contact region, making an electrical connection to said substrate tap region and said well contact region.

7. An integrated circuit, comprising:
a substrate comprising a semiconductor material of a first conductivity type;
a deep well of a second, opposite, conductivity type disposed in said semiconductor material of said substrate;
a deep isolation trench disposed through said deep well, so as to separate a functional portion of said deep well from a separated portion of said deep well, said separated portion being free of an active component of said integrated circuit;
an active component of said integrated circuit in said functional portion;
a well contact region of said second conductivity type in said separated portion, said well contact region being connected to a voltage terminal of said integrated circuit;
a substrate tap region of said first conductivity type in said substrate adjacent to said separated portion and proximate to said well contact region, said substrate tap region and said well contact region being in a same active area;

metal silicide on said active area containing said substrate tap region and said well contact region, making an electrical connection to said substrate tap region and said well contact region;
a substrate tap contact making an electrical connection to said metal silicide; and
a metal interconnect making an electrical connection to said substrate tap contact, said metal interconnect being connected to said voltage terminal.

8. The integrated circuit of claim 1, further comprising a shallow well of said second conductivity type in said separated portion under said well contact region.

9. The integrated circuit of claim 1, wherein said first conductivity type is p-type and said second conductivity type is n-type.

10. The integrated circuit of claim 1, wherein said first conductivity type is n-type and said second conductivity type is p-type.

11. The integrated circuit of claim 1, wherein said deep well extends to a depth of 1 micron to 5 microns.

12. An integrated circuit, comprising:
a substrate of a first conductivity type;
a deep well of a second different conductivity type disposed in said substrate;
a deep isolation trench disposed through said deep well and into a portion of the substrate outside of said deep well and having the first conductivity type, so as to separate a functional portion of said deep well from a separated portion of said deep well, said separated portion being free of an active component of said integrated circuit;
an active component of said integrated circuit in said functional portion; and
a well contact region of said second conductivity type in said separated portion, said well contact region being connected to a voltage terminal of said integrated circuit.

13. The integrated circuit of claim 12, further comprising:
a well contact making an electrical connection to said well contact region; and
a metal interconnect making an electrical connection to said well contact, said metal interconnect being connected to said voltage terminal.

14. The integrated circuit of claim 12, further comprising:
a substrate tap region of said first conductivity type in said substrate adjacent to said separated portion and proximate to said well contact region;
a well contact making an electrical connection to said well contact region;
a substrate tap contact making an electrical connection to said substrate tap region; and
a metal interconnect making an electrical connection to said well contact and said substrate tap contact.

15. The integrated circuit of claim 12, further comprising:
a substrate tap region of said first conductivity type in said substrate adjacent to said separated portion and proximate to said well contact region, said substrate tap region and said well contact region being in a same active area; and
metal silicide on said active area containing said substrate tap region and said well contact region, making an electrical connection to said substrate tap region and said well contact region.

16. The integrated circuit of claim 12, further comprising:
a substrate tap region of said first conductivity type in said substrate adjacent to said separated portion and proximate to said well contact region, said substrate tap region and said well contact region being in a same active area;
metal silicide on said active area containing said substrate tap region and said well contact region, making an electrical connection to said substrate tap region and said well contact region;
a substrate tap contact making an electrical connection to said metal silicide; and
a metal interconnect making an electrical connection to said substrate tap contact, said metal interconnect being connected to said voltage terminal.

17. The integrated circuit of claim 12, further comprising a shallow well of said second conductivity type in said separated portion under said well contact region.

18. The integrated circuit of claim 12, wherein said deep well extends to a depth of 1 micron to 5 microns.

* * * * *